United States Patent [19]

Veligdan et al.

[11] Patent Number: 5,441,569
[45] Date of Patent: Aug. 15, 1995

[54] APPARATUS AND METHOD FOR LASER DEPOSITION OF DURABLE COATINGS

[75] Inventors: James T. Veligdan, Manorville; Peter Vanier, Coram; Robert E. Barletta, Wading River, all of N.Y.

[73] Assignee: The United States of America as represented by the United States Department of Energy, Washington, D.C.

[21] Appl. No.: 158,862

[22] Filed: Nov. 29, 1993

[51] Int. Cl.6 .............................................. C23C 16/00
[52] U.S. Cl. ........................ 118/723 MP; 204/157.22; 117/904
[58] Field of Search ............... 118/723 MP, 722, 724; 204/157.22, 157.41, 157.61, 298.09, 298.26; 376/56, 57, 69, 97, 71; 117/904

[56] References Cited

U.S. PATENT DOCUMENTS

| | | | |
|---|---|---|---|
| 4,155,779 | 5/1979 | Auston | 148/1.5 |
| 4,699,801 | 10/1987 | Ito | 427/53.1 |
| 4,799,454 | 1/1989 | Ito | 118/723 |
| 4,891,491 | 1/1990 | Duley | 219/121.64 |
| 4,919,077 | 4/1990 | Oda | 118/723 |
| 5,207,878 | 5/1993 | Shimo | 204/157.41 |

FOREIGN PATENT DOCUMENTS

| | | |
|---|---|---|
| 61-87341 | 5/1986 | Japan . |
| 1-9622 | 1/1989 | Japan . |
| 1-309956 | 12/1989 | Japan . |
| 3-54884 | 3/1991 | Japan . |

Primary Examiner—R. Bruce Breneman
Assistant Examiner—Joni Y. Chang
Attorney, Agent, or Firm—Daniel D. Park; Thomas G. Anderson; William R. Moser

[57] ABSTRACT

Method and apparatus for depositing durable coatings onto the surface of a substrate without heating the entire substrate to high temperatures by using lasers to heat the substrate and dissociate a deposition gas. The apparatus comprises a deposition chamber for enclosing the substrate upon which a coating is to be deposited, gas delivery means for directing a flow of deposition gas on the substrate, a first laser for heating the substrate, and a second laser for irradiating the deposition gas to dissociate the gas. The method includes placing a substrate within a vacuum deposition chamber and directing a flow of deposition gas on the substrate. Then the substrate is heated with a first laser while the deposition gas is irradiated with a second laser to dissociate the deposition gas.

11 Claims, 1 Drawing Sheet

APPARATUS AND METHOD FOR LASER DEPOSITION OF DURABLE COATINGS

CONTRACTUAL ORIGIN OF THE INVENTION

The United States Government has rights in this invention pursuant to Contract No. DE-AC02-76CH00016 between the U.S. Department of Energy and Associated Universities, Inc.

BACKGROUND OF THE INVENTION

The present invention relates to an apparatus and method for depositing durable coatings, and, more particularly, to the deposition of refractory carbide coatings onto the surface of a substrate by using lasers to heat the substrate and increase the reactivity of metal halide deposition gases.

The use of durable materials such as refractory carbide coatings to protect and/or seal various substrates from the external environment is well established and includes such applications as nuclear fuel encapsulation and radioactive waste containment. Nuclear fuels such as uranium rods, pellets, or particles are often encapsulated in refractory carbide coatings to protect the fuel interior from the high temperatures that are produced within a nuclear reactor and to prevent the release of radioactive fission products from within the fuel structure. In particular, durable carbide coatings are useful in protecting small diameter fuel particles commonly used in high temperature gas reactors such as particle bed reactors where the normal operating temperatures can exceed 2000 degrees Kelvin. Similarly, containing or storing long term radioactive waste within a durable refractory carbide coating presents an attractive alternative to storing such waste in cement or concrete structures which may prove to be unstable in the long run.

Typically, refractory carbide coatings are applied to a graphite or a carbon composite substrate by using conventional chemical vapor deposition (CVD) or chemical vapor reaction (CVR) methods. The latter process, CVR, has proven to be especially effective in producing hard and dense carbide coatings. In this process a metal halide vapor reacts with the carbon in the substrate to produce the carbide. For instance, the reaction for depositing a coating such as tantalum carbide is:

$$TaCl_5 + C_{(substrate)} \rightarrow TaC + 5/2Cl_2$$

The reaction normally produces a carbide coating with a thickness of about 10 to 100 micrometers.

The process, however, requires extremely high temperatures, and depending on the carbide to be produced, the typical reaction such as shown above occurs optimally at a temperature range of about 1700 K. to 2600 K. The high temperatures present a problem in both nuclear fuel encapsulation and radioactive waste containment, since, in conventional CVD and CVR methods, the entire substrate is normally subjected to such high temperatures. With nuclear fuel, the high temperature may damage or weaken the structural integrity of the uranium fuel core as well as the buffer layer of pyrolytically deposited carbon and cause a deformation of the fuel structure with possible leakage of uranium or other fissile products from the core. In containing radioactive wastes, high temperatures create even a greater problem, since the waste, being typically in the form of an ion-exchange resin, is even more unstable at high temperatures.

Further, as the coating is produced at high temperatures, the grain size of the carbide material will naturally be large. Since grain size is related to porosity, large grain carbide coatings may more readily allow radioactive gases to diffuse out of the substrate or, conversely, allow external gases to diffuse into the substrate.

Finally, conventional CVD or CVR methods are not generally appropriate for performing spot repairs or depositing coatings of a predetermined pattern or shape. In the conventional methods, since the entire substrate is heated and exposed to the halide or other vapors, material deposition will take place in a random fashion wherever the vapors reacts with the substrate.

In view of the foregoing, the general object of this invention is to provide an apparatus and method for depositing a coating on a substrate without subjecting the substrate to the high temperatures associated with conventional CVD and CVR methods of deposition.

Another object of this invention is to provide an apparatus and method for depositing refractory carbide coatings which are dense and resistant to high temperatures.

Yet another object of this invention is to provide an apparatus and method for depositing coatings which can perform "spot repairs" on coatings and deposit precise coatings of predetermined shape or pattern.

Additional objects, advantages and novel features of the invention will become apparent to those skilled in the art upon examination of the following and by practice of the invention.

SUMMARY OF THE INVENTION

To achieve the foregoing and other objects, this invention provides a method and apparatus for depositing durable coatings onto the surface of a substrate without heating the entire substrate to high temperatures by using lasers to heat the substrate and dissociate a deposition gas. The apparatus comprises a deposition chamber for enclosing the substrate upon which a coating is to be deposited, gas delivery means for directing a flow of deposition gas on the substrate, a first laser for heating the substrate, and a second laser for irradiating the deposition gas to dissociate the gas. The first laser allows localized heating of the substrate, while the second laser, by dissociating the deposition gas, increases the reactivity of the deposition gas with the substrate. The method includes placing a substrate within a vacuum deposition chamber and directing a flow of deposition gas on the substrate. Then the substrate is heated with a first laser while the deposition gas is irradiated with a second laser to dissociate the deposition gas.

BRIEF DESCRIPTION OF THE DRAWING

The present invention is illustrated in the accompanying drawing where.

DESCRIPTION OF THE PREFERRED EMBODIMENT

Figure 1:
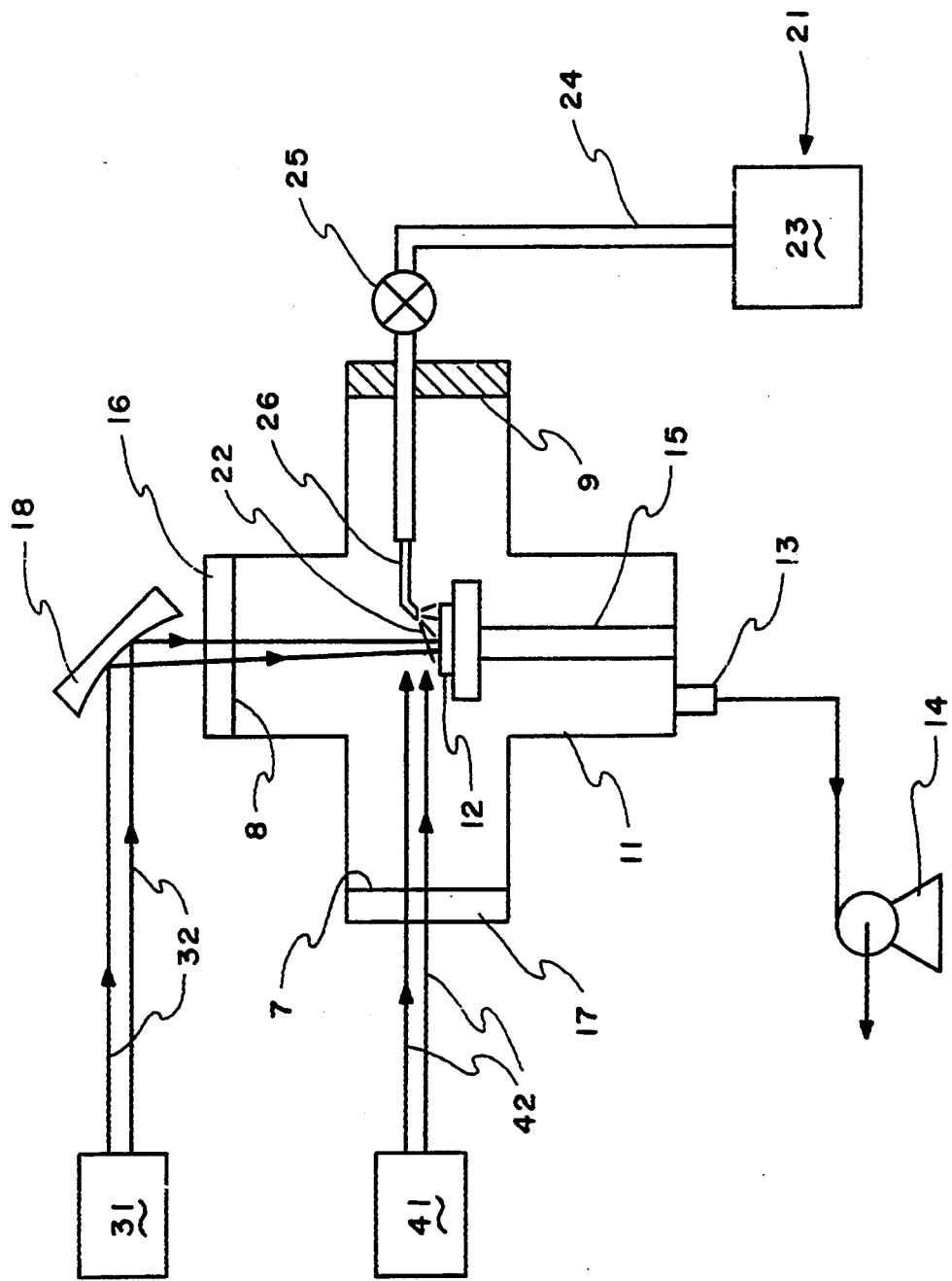
FIG. 1 is a schematic view of the deposition cell illustrating the interaction between the two laser beams, the deposition gas and the substrate.

Referring to FIG. 1, the deposition apparatus 10 embodying the invention includes a deposition chamber 11, a gas handling system 21, and two lasers 31 and 41. As will be described, the invention allows the deposition of a coating, such as a refractory carbide coating, onto the surface of a substrate 12 by heating the surface of the substrate 12 with a first laser 31 while directing, onto the substrate 12, a deposition gas 22 which is in turn being irradiated with a second laser 41. Using a first laser 31 to heat the substrate 12 localizes the heating to an area wherein the deposition is taking place, while irradiating the deposition gas 22 with a second laser 41 increases the reactivity of the gas 22 with the substrate 12. In the embodiment disclosed herein, the deposition of Tantalum Carbide (TaC) coatings are described, but the invention can facilitate the deposition of a wide range of materials including metal carbides and metal alloys.

As shown in FIG. 1, the deposition chamber 11 is a multi-apertured vacuum chamber that accommodates the delivery and subsequent interaction of the deposition gas 22, laser beams, 32 and 42, and the substrate 12. The apertures are configured such that the first and second apertures, 7 and 8, allow, respectively, the transmission of the laser beams, 32 and 42, while a third aperture 9 allows the deposition gas 22 to be brought into the chamber 11. A heated stage 15 whose temperature can be varied between room temperature and 700 K. is mounted on the base of the deposition chamber 11 to act as the support base for the substrate 12 and to heat the substrate 12. The stage 15, however, need not be heated and a non-heated stage 15 may be used, or alternatively, the substrate 12 may be placed within a heated fluidized bed (not illustrated). In the embodiment disclosed herein, the stage 15 is configured to extend into the central region of the chamber 11 so that the substrate 12 will be subjected to the deposition gas 22 and the lasers beams, 32 and 42. An exhaust port 13 provided in the base of the deposition chamber 11 which is in turn connected to a suitable vacuum pump 14, or the like, provides the means for evacuating ambient air from the chamber 11.

The first laser 31 is positioned outside the deposition chamber 11 and is aligned in a manner such that its beam 32 enters the deposition cell through the second aperture 8 to strike and heat the substrate 12. A convex mirror 18, or a similar focusing arrangement, positioned outside the second aperture 8 focuses the laser beam 32 to a desired beam width at the strike point. In the embodiment disclosed herein, a 3.5 watt continuous wave $CO_2$ laser, focused to about I millimeter in diameter was used to heat the surface of the substrate 12. A Zinc Selenide (ZnSe) window 16, which allows efficient transmission of infrared radiation, is positioned within the second aperture 8 to allow the transmission of the first, or $CO_2$, laser beam 32.

The gas handling system 21 includes a gas reservoir 23 and a gas delivery tube 24, which extends from the reservoir 23 into the deposition chamber to deliver the deposition gas 22 to the substrate 12. In delivery, the deposition gas 22 from the reservoir 23 is routed through a needle valve 25 in the gas delivery tube 24 and is then directed onto the substrate 12 through a nozzle 26 connected to the end of the delivery tube 24. The nozzle 26 is positioned such that a uniform flow of the deposition gas 22 of a desired flow density is directed over the surface of the substrate 12. In the embodiment disclosed herein, Tantalum Penta-chloride ($TaCl_5$) vapors produced by heating solid $TaCl_5$ in the reservoir 23 is used as the deposition gas 22, but, depending on the coating or refractory carbide that is to be deposited, various metal halides, nitrides or borides, as well as any other metal compounds favorable to vaporization and dissociation by laser may be used.

The second laser 41 is positioned outside of the deposition chamber 11 and is aligned in a manner such that its beam 42 is transmitted through the first aperture 7 to irradiate the deposition gas 22. Normally, the beam 42 is aligned such that irradiation of the deposition gas 22 takes place immediately above the surface of the substrate 12 that is being coated. In the embodiment disclosed herein, an KrF excimer laser operating at a wavelength of 248 nanometers was used since that wavelength is coincident with absorption maximum of the $TaCl_5$. The excimer laser 41 enhances the reactivity of the deposition gas 22 with the substrate 12 by facilitating dissociation of the gas 22, which in this embodiment is $TaCl_5$. A silica or quartz window 16, being conducive to the transmission of ultraviolet radiation, is positioned within the first aperture 7 and allows transmission of the laser beam 42 into the chamber 11 to irradiate the deposition gas 22.

In operation, the substrate 12 to be deposited with the coating is placed on the stage 15 within the deposition chamber 11 and ambient air is evacuated from the chamber through the exhaust port 13. In the embodiment disclosed herein, a graphite disk was used as the substrate 12. However, the substrate 12 is not limited to such, and may comprise a wide variety of materials depending on the type of coating that is to be deposited. For example, in depositing metal carbide coatings, a variety of carbon composite substances or even non-carbon substances may be used so long as carbon is made available at the surface of the substrate 12 to react with the deposition gas 22.

Next, the gas handling system 21 including the gas reservoir 23 and the gas delivery tube 24 is heated to obtain the desired gas pressure and flow of the deposition gas 22. The substrate 12 is also heated to an optimum temperature for deposition. The temperatures of the gas handling system 21 and the substrate 12 may vary depending on the type of material being deposited and the type of substrate 12 being used. In the preferred embodiment, the gas reservoir 23 was heated to 175° C. while the gas delivery tube 24 and the substrate 12 was heated to 195° C. The gas delivery tube 24, as well the substrate 12, is heated to a higher temperature to prevent condensation of the deposition gas 22. Once sufficient gas pressure is built-up within the reservoir 23, flow of the deposition gas 22 is initiated by opening the needle valve 25 to allow a continuous flow of the deposition gas 22 onto the substrate 12. In the embodiment described herein, gas flow was maintained at a pressure of about 200 torr.

Once a steady flow of the deposition gas 22 has been obtained, both the first and second lasers 31 and 41 are turned on such that the first laser 31 irradiates the substrate 12 while the second laser 41 irradiates the deposition gas 22. As describe above, the first laser 31 is a 3.5 watt $CO_2$ laser focused to about 1 mm in diameter. The laser 31 is aligned such that its beam 32 enters the deposition chamber through the ZnSe window 16 and irradiates the substrate 12 from a direction essentially perpendicular to the surface of the substrate 12. The second laser 41 is a pulsed excimer laser operating at a wavelength of 248 nanometers with a pulse energy of 145 mJ, pulse duration of 20 nanoseconds and pulse frequency of 80 pulses per second. The laser 41 is aligned such that its beam 42 enters the deposition chamber 11 through the quartz window 17 to irradiate the deposition gas 22.

After approximately 5 minutes of deposition, the deposition gas 22 flow and the lasers, 31 and 41, are turned off. Then the deposition chamber 11 is backfilled with an inert gas to prevent substrate 12 oxidation or other such reaction and to speed cooling of the deposition chamber 11. In the embodiment disclosed herein, the deposition results in a thin layer of fine grained tantalum carbide being placed upon the substrate 12 surface. Additionally, because the substrate 12 is precisely heated by lasers, and because deposition gases can be precisely directed, the embodied invention can be configured to make "spot repairs" or deposit precise coatings of predetermined shape or pattern on the substrate 12.

In an alternate embodiment, the invention can be used to deposit a layer of stainless steel on the surface of mild steel by using steel as the substrate 12 and chromium carbonyl $Cr(CO)_6$ and nickel carbonyl $Ni(CO)_4$ as the deposition gases 22. Using essentially the same apparatus and method as described herein, the steel substrate 12 is locally heated with a $CO_2$ laser 31 while a dual flow of chromium carbonyl and nickel carbonyl gases 22 are irradiated with an excimer laser 41 to dissociate the chromium and nickel atoms from the molecule. In this process, because the $CO_2$ laser locally heats the surface of the steel substrate 12, the chromium and nickel reacts with the steel surface to become stainless steel instead of merely being a chromium or nickel coating over the steel substrate 12.

The foregoing description of a preferred embodiment of the invention has been presented for purposes of illustration and description. It is not intended to be exhaustive or to limit the invention to the precise form disclosed. For instance, the lasers used in the invention need not be limited to the ones described in the preferred embodiment. Instead a variety of pulsed or continuous wave lasers may be used to achieve the desired deposition or coating. Further, multiple lasers may be used to either heat the substrate or to dissociate the deposition gas. The embodiment described herein explains the principles of the invention so that others skilled in the art may practice the invention in various embodiments and with various modifications as suited to the particular use contemplated. It is intended that the scope of the invention be defined by the claims appended hereto.

The embodiments of the invention in which an exclusive property or privilege is claimed are defined as follows:

1. A multi-laser deposition apparatus comprising:
   a deposition chamber for enclosing a substrate upon which a coating is to be deposited;
   at least one gas delivery means for directing a flow of deposition gas on the substrate;
   at least one first laser means for heating the substrate; and
   at least one second laser means for irradiating the deposition gas to dissociate said deposition gas.

2. The apparatus of claim 1 wherein said deposition chamber includes an exhaust port for evacuating ambient air from said chamber.

3. The apparatus of claim 1 and means for directing and focusing the beam from said first laser means.

4. The apparatus of claim 1 wherein said deposition gas is selected from a group consisting of metal halides, metal nitrides and metal bromides.

5. The apparatus of claim 1 wherein said deposition gas is Tantalum Penta-chloride, $TaCl_5$.

6. The apparatus of claim 1 wherein said first laser means and second laser means include, respectively, a $CO_2$ laser and an excimer laser.

7. The apparatus of claim 1 wherein said gas delivery means and said substrate are heated to obtain desired gas pressure and flow and optimum temperature for deposition.

8. The apparatus of claim 1 and a substrate selected from the group consisting of carbon, carbon compounds, and graphite.

9. The apparatus of claim 1 and a substrate of steel and wherein said deposition gas includes chromium carbonyl and nickel carbonyl.

10. The apparatus of claim 2 and a pump connected to said exhaust port for pumping said ambient air through the exhaust port.

11. An apparatus for depositing refractory carbide coatings on a substrate comprising:
    a vacuum deposition chamber for enclosing the substrate;
    a stage mounted within the deposition chamber and configured to support and heat the substrate;
    gas delivery means for directing a flow of metal halide vapors on the substrate;
    first laser means for heating the substrate; and
    second laser means for irradiating the metal halide vapors to dissociate and vapors.

* * * * *